United States Patent
Hsieh

(10) Patent No.: US 11,869,515 B2
(45) Date of Patent: Jan. 9, 2024

(54) APPARATUS AND METHOD FOR ENHANCING CALL QUALITY OF WIRELESS EARBUDS

(71) Applicant: Airoha Technology Corp., Hsinchu (TW)

(72) Inventor: Yu-Cheng Hsieh, Hsinchu (TW)

(73) Assignee: AIROHA TECHNOLOGY CORP., Hsinchu (TW)

(*) Notice: Subject to any disclaimer, the term of this patent is extended or adjusted under 35 U.S.C. 154(b) by 112 days.

(21) Appl. No.: 17/357,187

(22) Filed: Jun. 24, 2021

(65) Prior Publication Data
US 2022/0165279 A1 May 26, 2022

(30) Foreign Application Priority Data

Nov. 25, 2020 (CN) .......................... 202011339118.9

(51) Int. Cl.
*G10L 19/005* (2013.01)
*H04R 1/10* (2006.01)
(Continued)

(52) U.S. Cl.
CPC .......... *G10L 19/005* (2013.01); *G10L 19/167* (2013.01); *H03F 3/183* (2013.01);
(Continued)

(58) Field of Classification Search
CPC ..... G10L 19/00; G10L 19/005; G10L 19/167; G10L 19/16; G10L 19/18; G10L 21/0208;
(Continued)

(56) References Cited

U.S. PATENT DOCUMENTS

2007/0123192 A1  5/2007  Sinai
2008/0008341 A1*  1/2008  Edwards .............. H04R 25/552
 381/60
(Continued)

FOREIGN PATENT DOCUMENTS

CN  106062870 A  10/2016
TW  200803426 A  1/2008

OTHER PUBLICATIONS

English Translation of Taiwanese Search Report for Application No. 109141331 dated Nov. 25, 2020.

*Primary Examiner* — Leshui Zhang
(74) *Attorney, Agent, or Firm* — Birch, Stewart, Kolasch & Birch, LLP

(57) ABSTRACT

The invention relates to apparatuses and methods for enhancing call quality in wireless earbuds. A first wireless earbud includes a first speaker and a first downlink speech process path, and a second wireless earbud includes a second speaker and a second downlink speech process path. The first and the second downlink speech process paths receive the same mono speech data from a mobile phone, and process the mono speech data to generate first and second analog signals, respectively, so that the first and the second speakers play the first and second analog signals, respectively. An inverter is disposed on the first downlink speech process path to generate the inverted digital data or analog signal from received digital data or analog signal corresponding to the mono speech data, but no inverter is disposed on the second downlink speech process path.

12 Claims, 14 Drawing Sheets

(51) Int. Cl.
  *G10L 19/16*  (2013.01)
  *H04W 88/02*  (2009.01)
  *H03F 3/183*  (2006.01)

(52) U.S. Cl.
  CPC ......... *H04R 1/1016* (2013.01); *H04R 1/1041* (2013.01); *H03F 2200/03* (2013.01); *H04R 2420/07* (2013.01); *H04W 88/02* (2013.01)

(58) Field of Classification Search
  CPC ..... G10L 21/02; H03F 3/183; H03F 2200/03; H04R 1/1016; H04R 1/10; H04R 1/1041; H04R 1/1083; H04R 2420/07; H04R 2201/107; H04R 25/554; H04R 25/00; H04W 88/02; H04L 1/0003; H04M 1/6066; H04M 9/082; G10K 11/178; G06F 3/162
  USPC .... 704/200, 205, 200.1, 206, 207, 209, 216, 704/217, 218, 219, 220, 226, 233, 237; 381/309, 310, 311, 26, 312–321, 74, 77, 381/78, 79, 80, 81, 85, 94.2, 94.1, 61, 66, 381/94.3, 94.5, 94.7, 97, 98, 99, 100, 381/101, 103, 107, 108, 110, 119, 122, 381/123, 111, 116, 117; 700/94
  See application file for complete search history.

(56) References Cited

U.S. PATENT DOCUMENTS

| | | | |
|---|---|---|---|
| 2008/0076489 A1* | 3/2008 | Rosener | H04M 1/6066 455/575.2 |
| 2015/0163819 A1 | 6/2015 | Yousefi et al. | |
| 2015/0230033 A1 | 8/2015 | Sprague et al. | |
| 2016/0357987 A1 | 12/2016 | Heo et al. | |
| 2017/0078807 A1* | 3/2017 | Mustiere | H04R 25/552 |

* cited by examiner

APPARATUS AND METHOD FOR ENHANCING CALL QUALITY OF WIRELESS EARBUDS

CROSS-REFERENCE TO RELATED APPLICATIONS

This application claims the benefit of priority to Patent Application No. 202011339118.9, filed in China on Nov. 25, 2020; the entirety of which is incorporated herein by reference for all purposes.

BACKGROUND

The disclosure generally relates to wireless earbuds and, more particularly, to apparatuses and methods for enhancing call quality of wireless earbuds.

Wireless earbuds use Bluetooth connectivity to receive speech signal by radio waves from source devices, such as mobile phones, etc. Due to environmental interference, packets transmitted from the source device to the wireless earbuds may be lost, thus, the wireless earbuds would implement the packet loss concealment (PLC) techniques to mask the effects of packet loss in communications. However, the existing implementation of PLC technology affects the user's sense in hearing so leads to poor experience. Therefore, it is desirable to have apparatuses and methods for enhancing call quality of wireless earbuds to address the aforementioned problems.

SUMMARY

The disclosure relates to an embodiment of an apparatus for enhancing call quality, applied in a pair of wireless earbuds. The apparatus mainly includes a first wireless earbud and a second wireless earbud. The first wireless earbud includes a first speaker and a first downlink speech process path, and the second wireless earbud includes a second speaker and a second downlink speech process path. The first and second downlink speech process path are arranged operably to receive mono speech data from a mobile phone, and process the mono speech data to generate a first and a second analog signals, respectively, so that the first and the second speakers would play the first and the second analog signals, respectively. An inverter is disposed on the first downlink speech process path and is arranged operably to generate the inverted data or signal from the received data or signal. But, no inverter is disposed on the second downlink speech process path.

The disclosure further relates to an embodiment of an apparatus for enhancing call quality applied in a wireless earbuds. The apparatus mainly includes a packet loss concealment (PLC) processor and an inverter. The PLC processor is arranged operably to perform an algorithm for reducing effects of lost packets. The inverter is disposed on a downlink speech process path which is formed between the PLC processor and a digital-to-analog converter, and is arranged operably to inverter speech data and output the inverted speech data to a speaker for producing a sound corresponding to the inverted speech data.

The disclosure further relates to an embodiment of a method for enhancing call quality applied in a pair of wireless earbuds. The method mainly includes: receiving, by a first wireless earbud, a mono speech stream from a mobile phone and inverting a first speech data or signal corresponding to the mono speech stream on a first downlink speech process path in the first wireless earbud; receiving, by a second wireless earbud, the mono speech stream from the mobile phone but not inverting a second speech data or signal corresponding to the mono speech stream on a second downlink speech process path in the second wireless earbud, thereby enabling the first speaker of the first wireless earbud and the second speaker of the second wireless earbud to produce different speech signals.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words described the relationship between elements should be interpreted in a like fashion (e.g., "between" versus "directly between," "adjacent" versus "directly adjacent." etc.)

During the communication between the wireless earbuds and the mobile phone, packet loss may occur. Since the packet loss may only occur in any one of the pair of wireless earbuds, the one with packet loss implements packet loss concealment technique and the other does not, resulting in that speech signals from such two wireless earbuds may be different from each other in some short predetermined time intervals. The speech signal difference in such time interval could be noticed by human brain as pop sounds and make users feel uncomfortable during a call. Therefore, the present invention proposes an apparatus and a method for enhancing the call quality of wireless earbuds to solve the above-mentioned problems.

Figure 1:
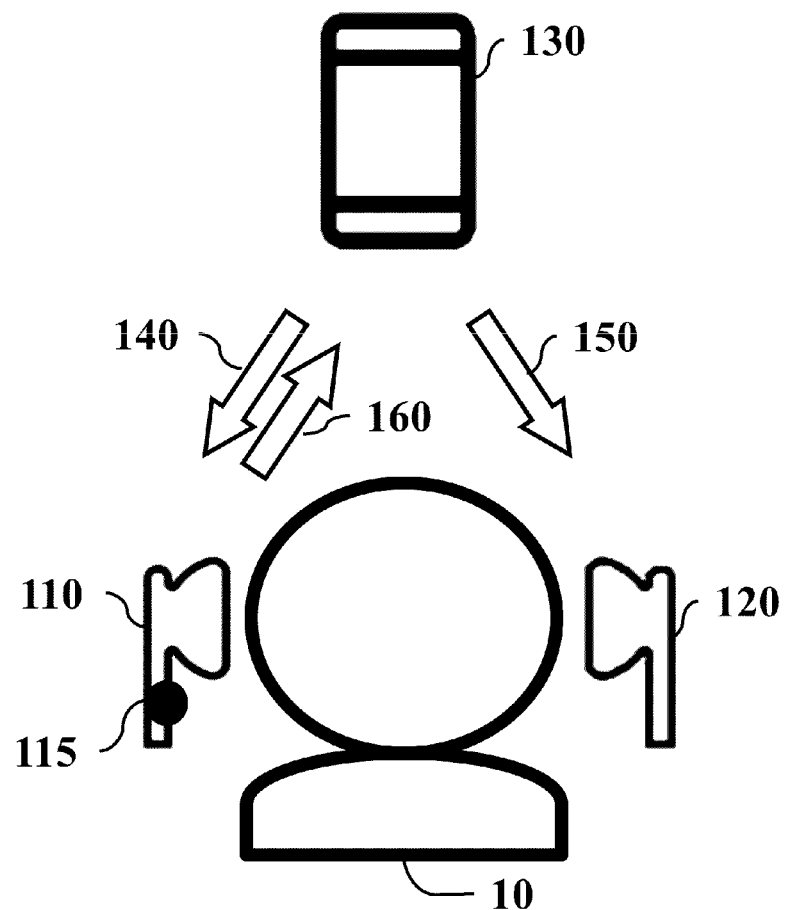
FIG. 1 is a schematic diagram of wireless communications according to an embodiment of the present invention.

Referring to FIG. 1, a user 10 may communicate with another remote user (not shown in FIG. 1) by a mobile phone 130 via a wireless network. The mobile phone 130 has the ability to transmit or receive data to or from a base station (not shown in FIG. 1) using the wireless communications protocol. The wireless communications protocol may be the global system for mobile communications/general packet radio service/enhanced data rates for GSM evolution (GSM/GPRS/EDGE), the wideband code division multiple access (WCDMA), the CDMA2000, the universal mobile telecommunications system (UMTS), the time division-synchronous code division multiple access (TD-SCDMA), long term evolution (LTE), frequency division-long term evolution (FD-LTE), time division-long term evolution (TD-LTE), IMT-2020, Wi-Fi, and so on. The exchanged data may be circuit-switched (CS) or packet-switched (PS) data carrying speech signals of users.

Furthermore, in an embodiment, the user 10 obtains data of the mobile phone 130 through wireless earbuds. The wireless earbuds are a pair of apparatuses with wireless communications capabilities, including a left wireless earbud 110 and a right wireless earbud 120, and no physical wire line is connected between the left wireless earbud 110 and the right wireless earbud 120. A wireless communications protocol, such as the Bluetooth advanced audio distribution profile (A2DP) packets or the Bluetooth low energy Audio (LE Audio), etc., may be used to transfer packets carrying user's speech signals between the mobile phone 130 and the left wireless earbud 110 and between the mobile phone 130 and the right wireless earbud 120. In alternative embodiments, a peer-to-peer (P2P) wireless communications protocol, such as the Wi-Fi direct, may be used between the mobile phone 130 and the left wireless earbud 110 and between the mobile phone 130 and the right wireless earbud 120, and the present invention is not limited thereby. When the mobile phone 130 establishes a call connection with the remote communications device, the left wireless earbud 110 and the right wireless earbud 120 receive downlink packets 140 and 150 from the mobile phone 130 and decode speech data in the received packets, respectively, and then play the decoded speech data. In the ideal situation, the speech data received by the left wireless earbud 110 and the right wireless earbud 120 are the same mono speech data.

The left wireless earbud 110 could be provided with a microphone 115 for obtaining speech signals of the user 10. In alternative embodiments, the microphone 115 may be provided in the right wireless earbud 120, and the present invention is not limited thereby. In a call connection, the left wireless earbud 110 activates the microphone 115 to obtain the speech signal of the user 10, and encodes and packetizes the speech data or speech signals into uplink packets 160 to be transmitted to the mobile phone 130, so that the mobile phone 130 transmits speech signals of the user 10 to a remote user.

Due to environmental interference, the packets transmitted from the mobile phone 130 to the left wireless earbud 110 or to the right wireless earbud 120 may be lost. Therefore, the left wireless earbud 110 or the right wireless earbud 120 may perform a packet loss concealment (PLC) algorithm to mask (or minimize) the effect of packet loss during wireless data transmission.

Figure 2:
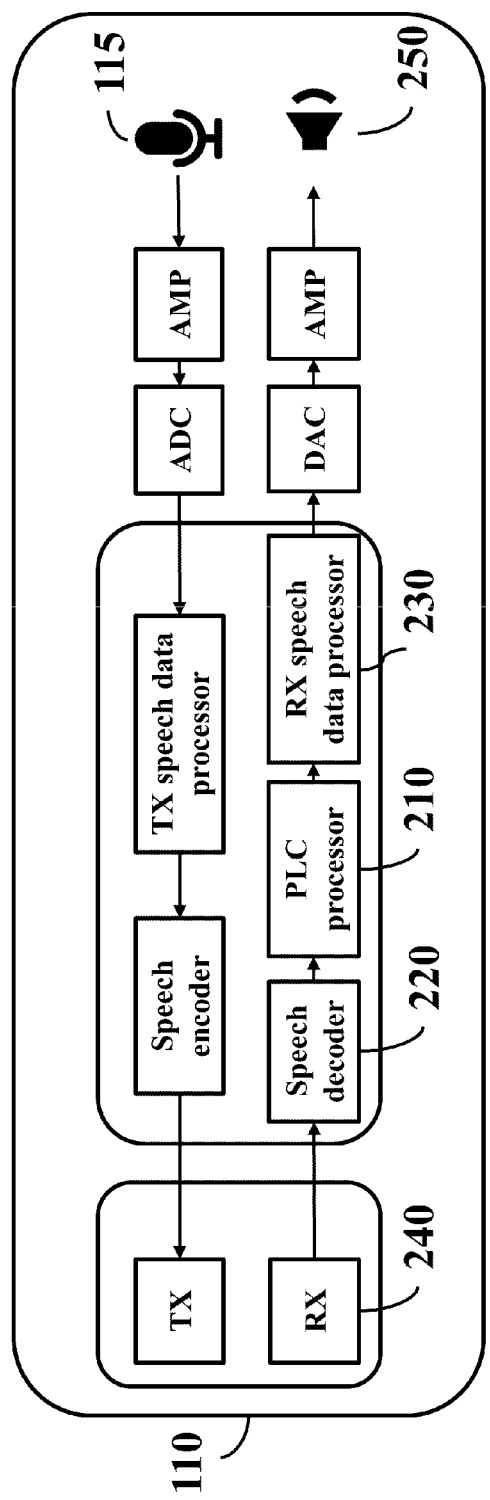
FIG. 2 is a block diagram of a wireless earbud according to some implementations.

Referring to the block diagram of the embodiment shown in FIG. 2, the left wireless earbud 110 includes a downlink speech process path from a receiver (RX) 240 to a speaker 250. The downlink speech process path includes a PLC processor 210, which is used to receive decoded speech data from a speech decoder 220, perform the PLC algorithm to compensate the lost packets in the decoded data, and transmit the compensated data to the RX speech data processor 230.

Figure 3:
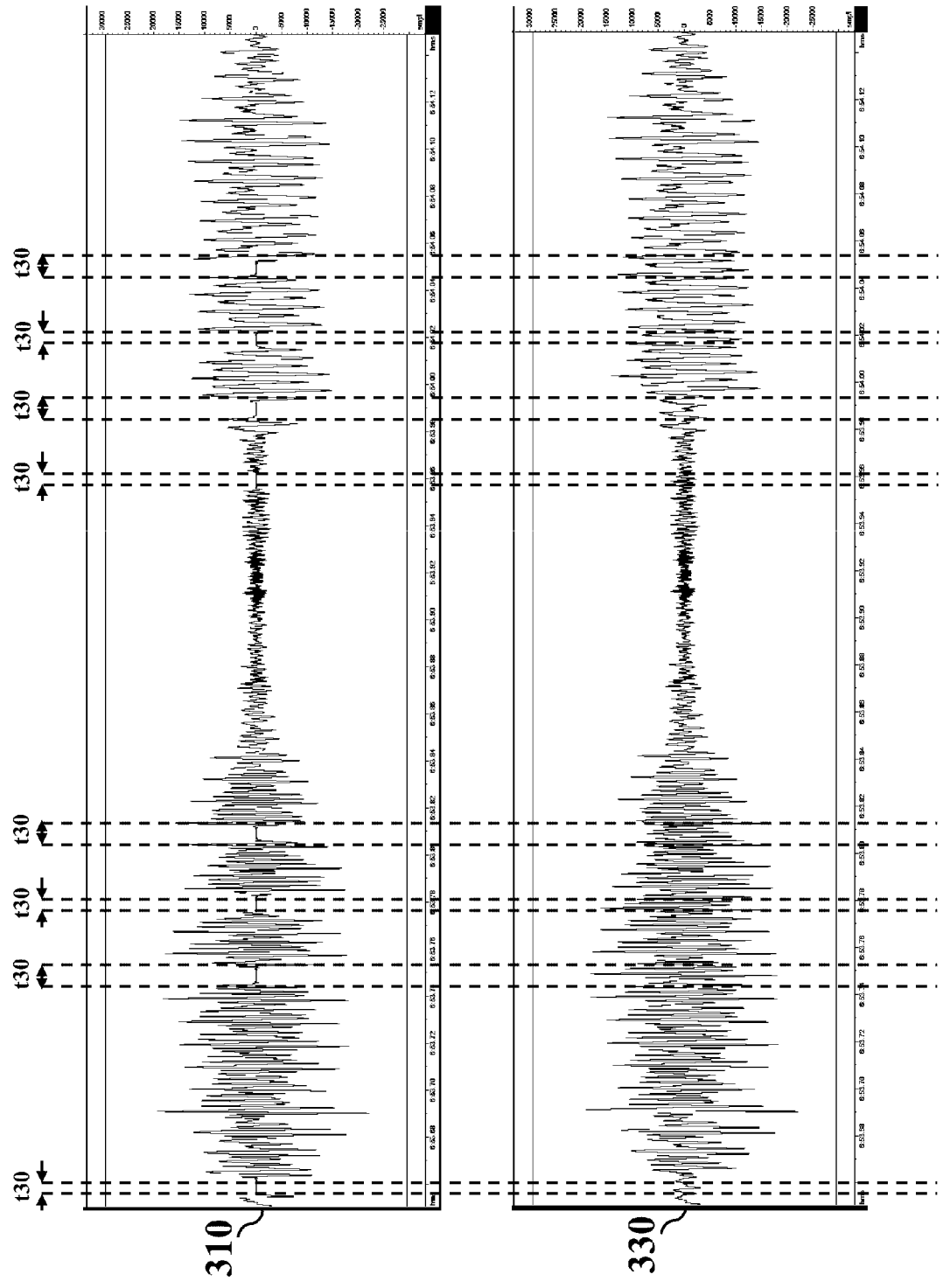
FIG. 3 shows a schematic diagram illustrating the compensation to lost speech signals according to some implementations.

For better understanding of the effect from PLC algorithm, for example, please refer to FIG. 3, which shows waveforms 310 and 330 to represent the signals before and after compensation by the PLC processor 210, respectively. In detail, the waveform 310 represents the speech signal corresponding to the speech data received by the PLC processor 210, where the packet loss is occurred in the time intervals t30 to cause almost no signal is presented in the time intervals t30. The waveform 330 represents the speech signal undergone the PLC algorithm by the PLC processor 210, in particular, the compensated signal in the time intervals t30.

It should be noted that, although the PLC algorithm can compensate for packet loss, it's still limited by the performance of the algorithm, and the compensated packets cannot be exactly the same as the lost ones. In other words, the compensated signal in the time intervals t30 of the waveform 330 would not the same as that carried in the lost packets transmitted in the time interval t30, leading to the user 10 to have a poor experience in hearing. The detailed description is as follows.

Figure 4:
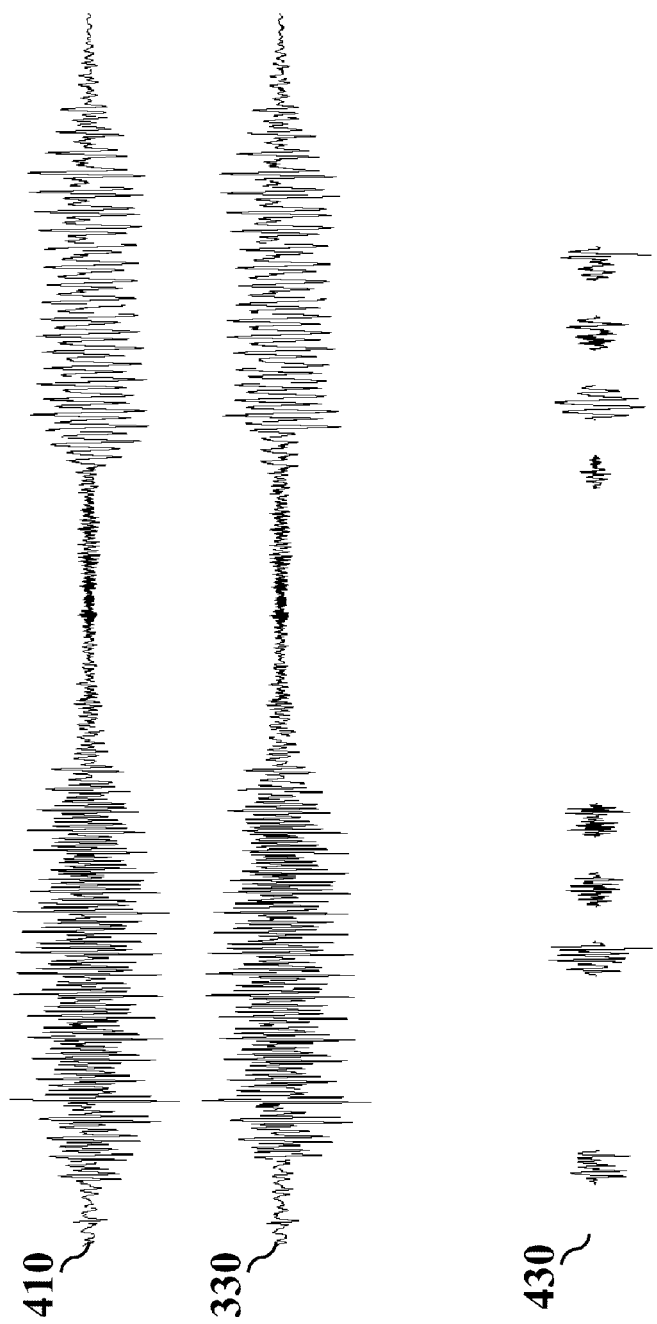
FIG. 4 shows a schematic diagram of the difference between a perfect speech signal and a compensated speech signal according to some implementations.

Referring to FIG. 4, for example, supposes that the right wireless earbud 120 receives entire packets successfully, but the left wireless earbud 110 loses some packets. The waveform 410 shows the speech signal output from the speaker of right wireless earbud 120. The waveform 330 shows the speech signal output from the speaker 250 of the left wireless earbud 110, which is undergone the PLC algorithm by the PLC processor 210. The waveform 430 shows the difference between the waveforms 410 and 330. Since the data in the time intervals t30 that is compensated in the left wireless earbud 110 is usually different from that is received by the right wireless earbud 120 in the time intervals t30, as shown in the waveform 430, the waveform 430 has relatively significant changes in a specific time periods. Therefore, the brain of the user 10 would notice short-term inconsistent sounds between left ear and right ear and would feel pop sounds, which make the user 10 feel uncomfortable in a phone call.

Figure 5:
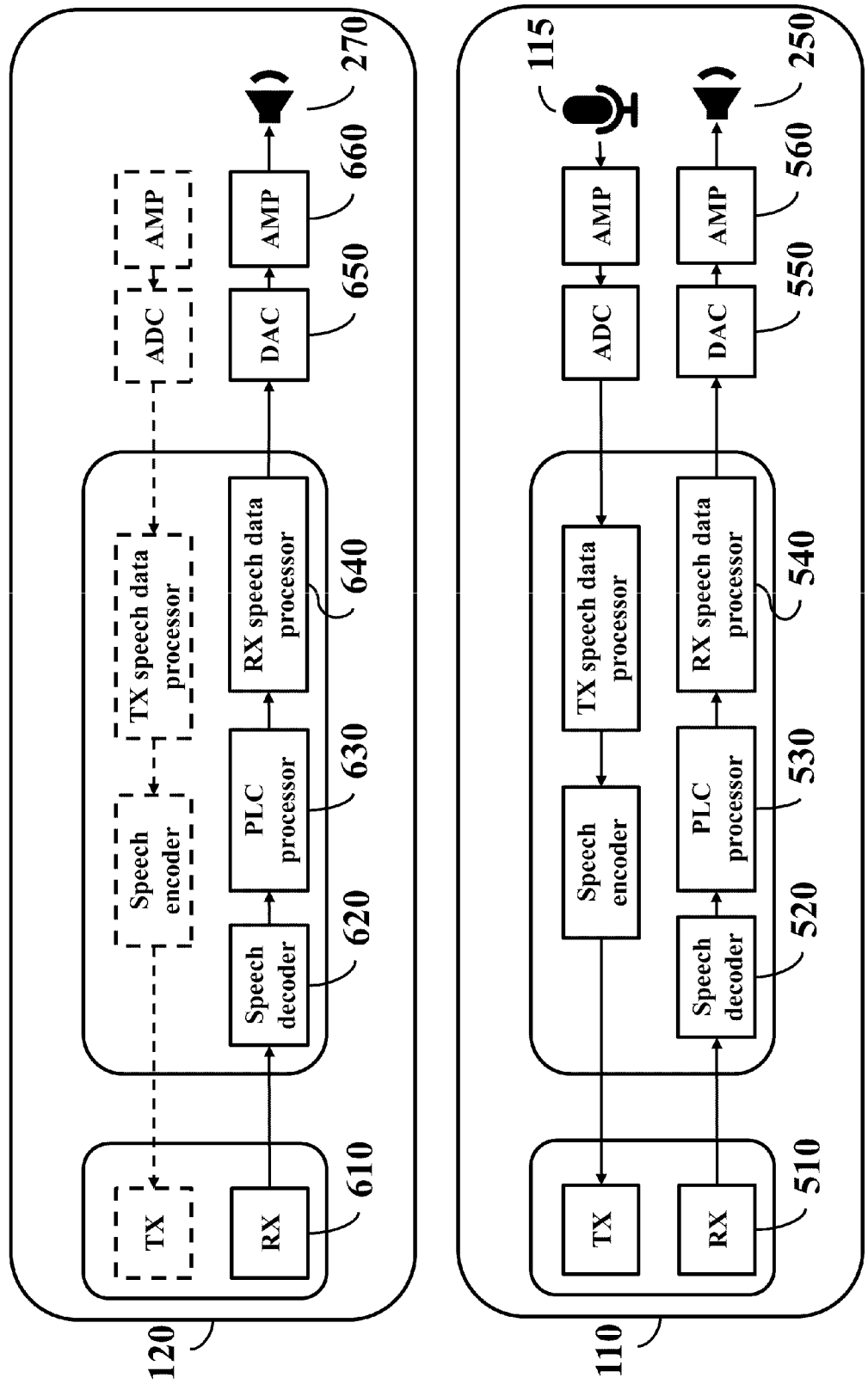
FIGS. 5 to 11 are block diagrams of wireless earbuds according to an embodiment of the present invention.

Referring to FIG. 5, the embodiment of FIG. 5 is similar to the embodiment of FIG. 2, except that FIG. 5 further illustrates the right wireless earbud 120. In addition, the left wireless earbud 110 of FIG. 5 is similar with the left wireless earbud 110 of FIG. 2. For the convenience of description and identification, in FIG. 5, the receiver 240, the speech decoder 220, the PLC processor 210 and the left wireless earbud 110 and the RX speech data processor 230 in FIG. 2 are renumbered.

Referring to FIG. 5, the left wireless earbud 110 may include a downlink speech processing path, on which a receiver 510, a speech decoder 520, a PLC processor 530, an RX speech data processor 540, a digital-to-analog converter (DAC) 550 and an amplifier (AMP) 560 are arranged in sequence. The receiver 510, the speech decoder 520, the PLC processor 530, the RX speech data processor 540, and the digital-to-analog converter 550 may be integrated in one or more integrated circuits (IC). When the mobile phone 130 establishes or builds a call connection with the remote communications device, the receiver 510 is used to receive radio frequency (RF) signals, which carries packets of speech messages of remote user from the mobile phone 130. The speech decoder 520, the PLC processor 530 and the RX speech data processor 540 may be implemented by a dedicated digital circuit, or a general-purpose hardware, such as a digital signal processor (DSP) when loading and executing specific code.

The speech decoder 520 may be a modified smart bitrate control (mSBC) decoder used to obtain a mono stream from Bluetooth A2DP packets, or a low-complexity communication codec (LC3) used to obtain a mono stream from LE Audio packets, and the sampling frequency may be up to 48 kHz.

The PLC processor 530 may perform any well-known algorithm, such as the waveform substitution, a model-based method, etc., to minimize the practical effect of lost packets in digital communications.

The RX speech data processor 540 may perform any well-known algorithm, such as noise reduction (NR), dynamic range compression (DRC), etc., to improve call quality.

The digital-to-analog converter 550 could convert digital mono streams into analog signals.

The amplifier 560 increases the power of analog signal and drives the speaker 250 to produce sound, so the user 10 can hear the speech message from the remote user through his or her left ear.

The right wireless earbud 120 may include a downlink speech process path, on which a receiver 610, a speech decoder 620, a PLC processor 630, an RX speech data processor 640, a digital-to-analog converter 650 and an amplifier 660 are arranged in sequence. Since the structures and functions of the elements 610 to 660 are similar to the elements 510 to 560 respectively, here will not be repeated in details for brevity. The receiver 610, the speech decoder 620, the PLC processor 630, the RX speech data processor 640, and the digital-to-analog converter 650 may be integrated in one or more integrated circuits (IC). Due to no microphone in the right wireless earbud 120, the components on the uplink speech process path from the amplifier to the transmitter (TX) are disabled, referring to the square filled with backslashes in FIG. 5.

However, the embodiment shown in FIG. 5 may cause a technical problem that arises when PLC algorithm runs as described above. To solve the problems, embodiments of the present invention propose a call quality improvement apparatus, in which an inverter (INV) is disposed on the downlink speech process path in one wireless earbud to generate data or signals that are inverted from the received speech data or speech signals, but no such INV is disposed on the downlink speech process path in the other wireless earbud, so that when a call connection is established, because the speech signals continually heard by the left and right ears of the user 10 are completely different from each other, and the user 10 will not feel pop sounds.

In some embodiments, the inverter is arranged between the PLC processor 530 and the amplifier 560 on the downlink speech process path of the left wireless earbud 110. However, in some embodiments where the inverter is provided in the right wireless earbud 120 instead of the left wireless earbud 110, the inverter is arranged between the PLC processor 630 and the amplifier 660 on the downlink speech process path of the right wireless earbud 120.

Figure 6:
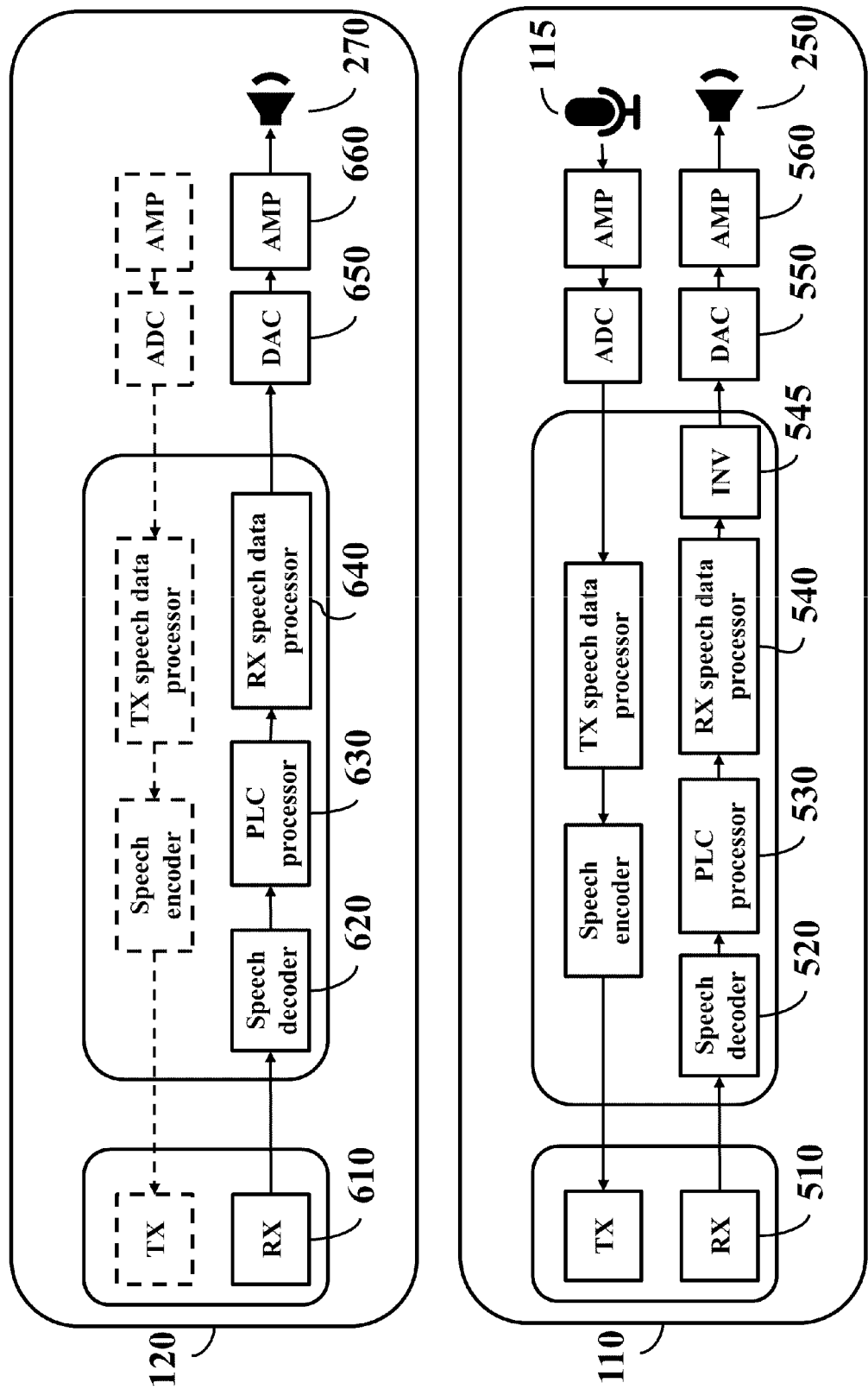

In some embodiments, referring to FIG. 6, an INV 545 may be provided between the RX speech data processor 540 and the digital-to-analog converter 550 on the downlink speech process path in the left wireless earbud 110 to receive improved speech data from RX speech data processor 540, invert the improved speech data, and output the inverted data to the digital-to-analog converter 550, wherein the improved speech data is related to the compensated speech data. However, in the right wireless earbud 120, there is no similar component with an inverting function between the RX speech data processor 640 and the digital-to-analog converter 650.

Figure 7:
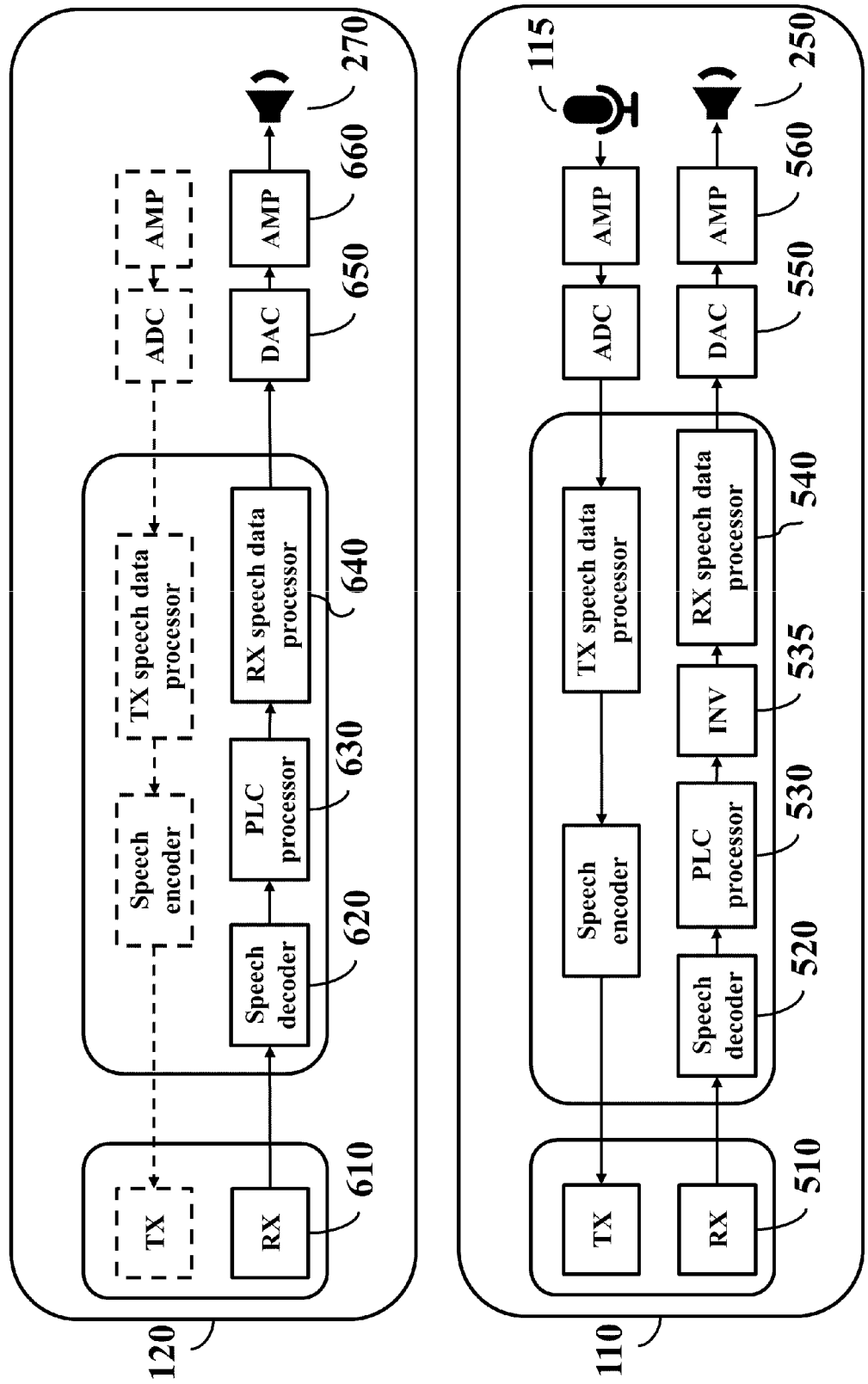

In alternative embodiments, referring to FIG. 7, an INV 535 may be provided between the PLC processor 530 and the RX speech data processor 540 on the downlink speech process path in the left wireless earbud 110 to receive the compensated speech data from the PLC processor 530, invert the compensated speech data, and output the inverted data to the RX speech data processor 540. However, in the right wireless earbud 120, there is no similar component with an inverting function between the PLC processor 630 and the RX speech data processor 640.

Figure 8:
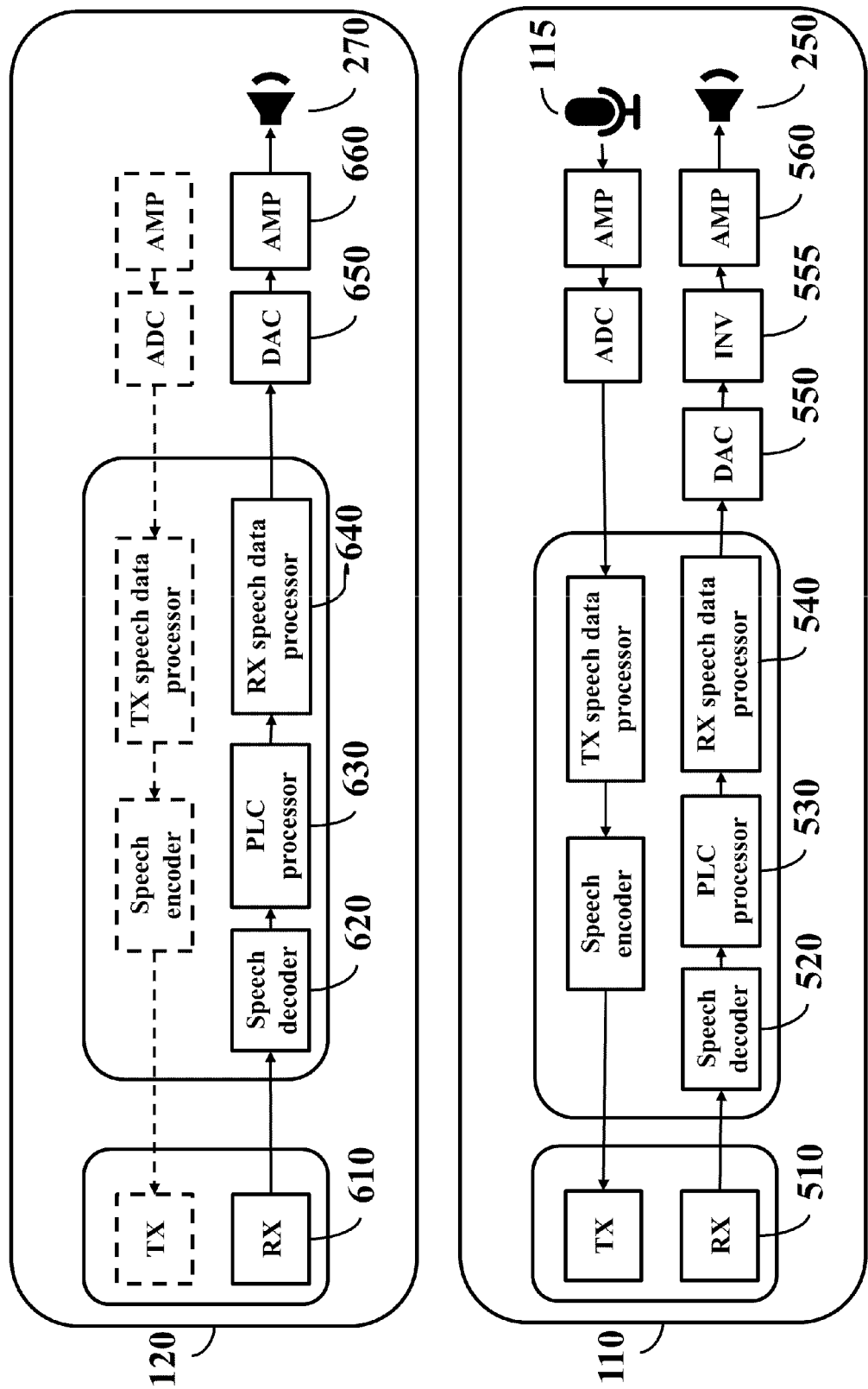

In alternative embodiments, referring to FIG. 8, an INV 555 is provided between the digital-to-analog converter 550 and the amplifier 560 on the downlink speech process path in the left wireless earbud 110 to receive analog signals from the digital-to-analog converter 550, invert the analog signals, and output the inverted analog signal to the amplifier 560, wherein the analog signals are related to the compensated speech data. However, in the right wireless earbud 120, there is no similar component with an inverting function between the digital-to-analog converter 650 and the amplifier 660.

Figure 9:
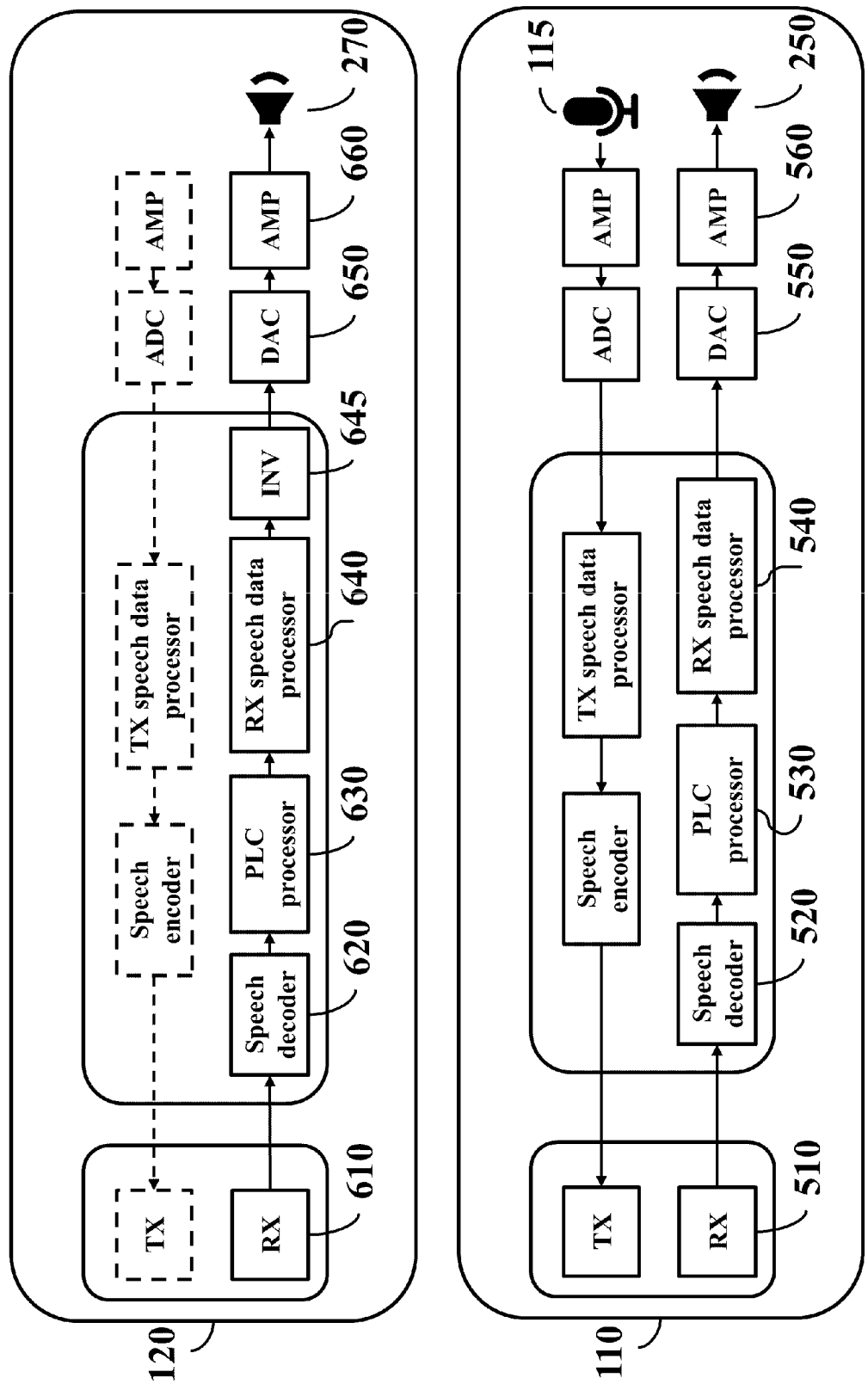

In alternative embodiments, referring to FIG. 9, an inverter 645 may be provided between the RX speech data processor 640 and the digital-to-analog converter 650 on the downlink speech process path in the right wireless earbud 120 to receive the improved speech data from the RX speech data processor 640, invert the improved speech data, and output the inverted data to the digital-to-analog converter 650. However, in the left wireless earbud 110, there is no similar component with an inverting function between the RX speech data processor 540 and the digital-to-analog converter 550.

Figure 10:
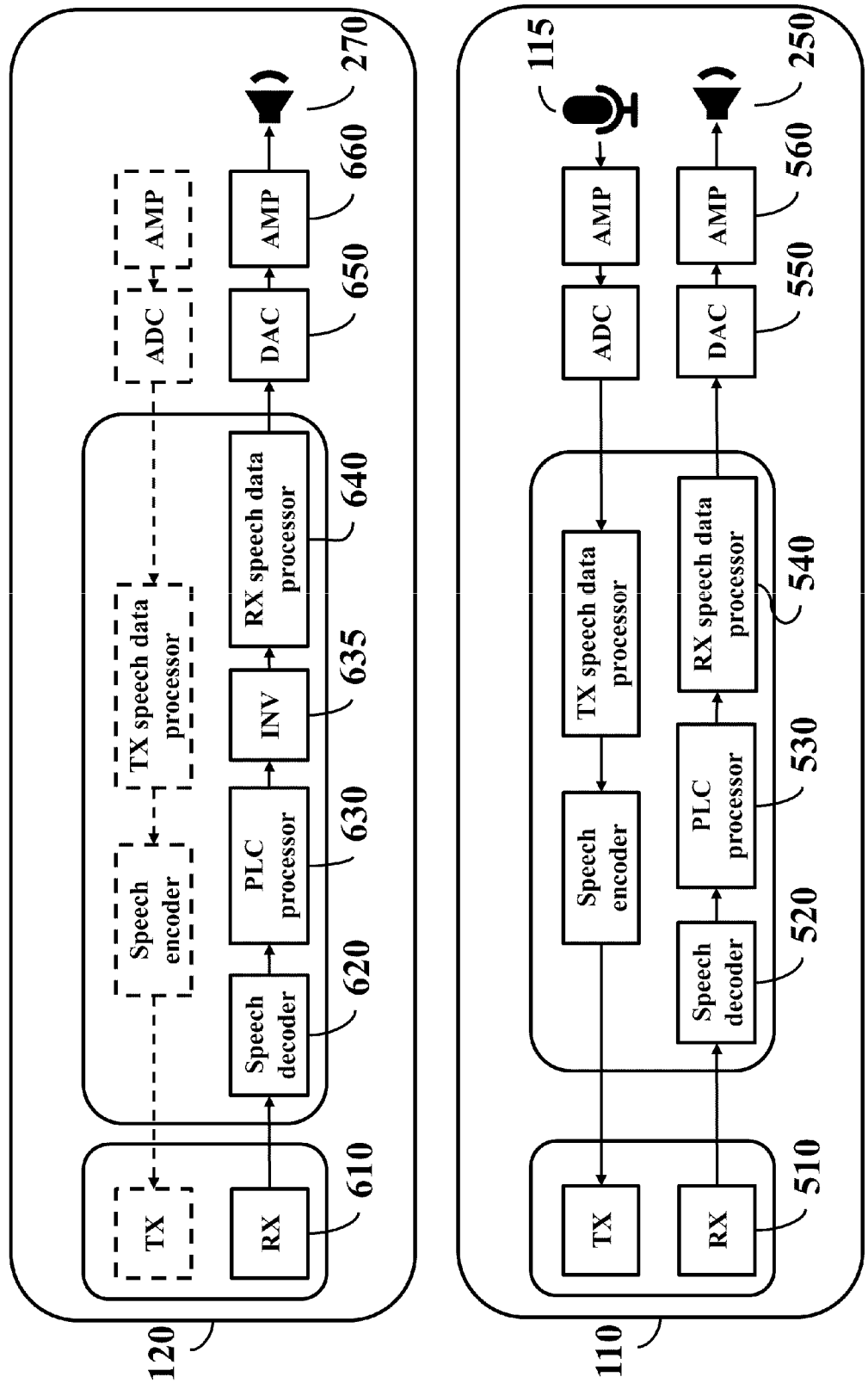

In alternative embodiments, referring to FIG. 10, an INV 635 is provided between the PLC processor 630 and the RX speech data processor 640 on the downlink speech process path in the right wireless earbud 120 to receive the compensated speech data from the PLC processor 630, invert the compensated speech data, and output the inverted data to the RX speech data processor 640. However, in the left wireless earbud 110, there is no similar component with an inverting function between the PLC processor 530 and the RX speech data processor 540.

Figure 11:
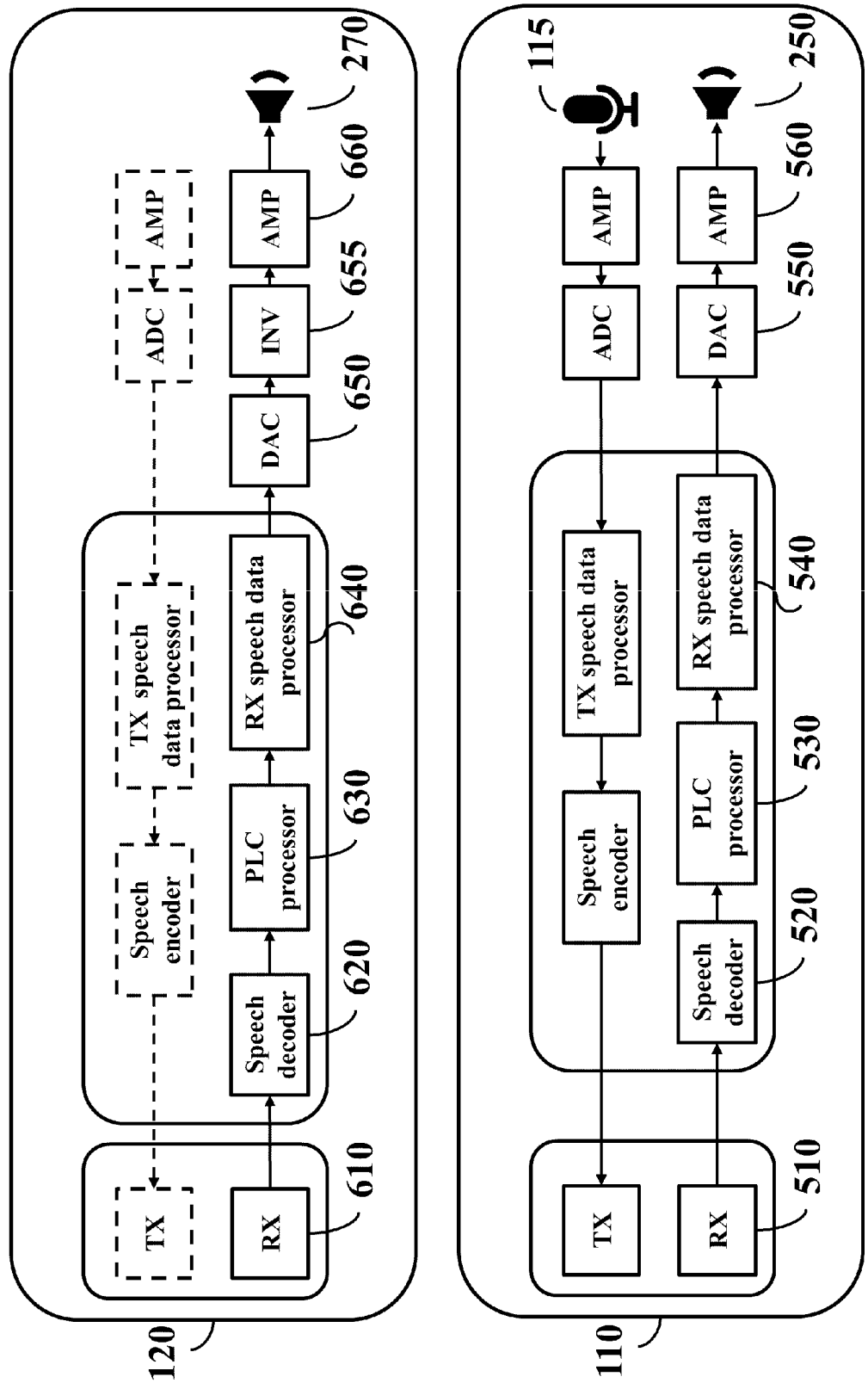

In alternative embodiments, referring to FIG. 11, an INV 655 is provided between the digital-to-analog converter 650 and the amplifier 660 on the downlink speech process path in the right wireless earbud 120 to receive analog signals from the digital-to-analog converter 650, invert the analog signals, and output the inverted analog signals to the amplifier 660. However, in the left wireless earbud 110, there is no similar component with an inverting function between the digital-to-analog converter 550 and the amplifier 560.

In some embodiments, the inverter 555 or 655 described above may be implemented by analog circuits. In other embodiments, the functions of inverters 535, 545, 635, and 645 as described above may be realized when the DSP loads and executes specific code.

When digital speech data is processed by the inverter 545 or 535 as shown in FIG. 6 or FIG. 7, or when analog speech signals are processed by the inverter 555 as shown in FIG. 8, the amplifier 560 outputs inverted speech signals. When the digital speech data is processed by the inverter 645 or 635 as shown in FIG. 9 or 10, or when analog speech signals are processed by the inverter 655 as shown in FIG. 11, the amplifier 660 outputs inverted speech signals.

Figure 12:
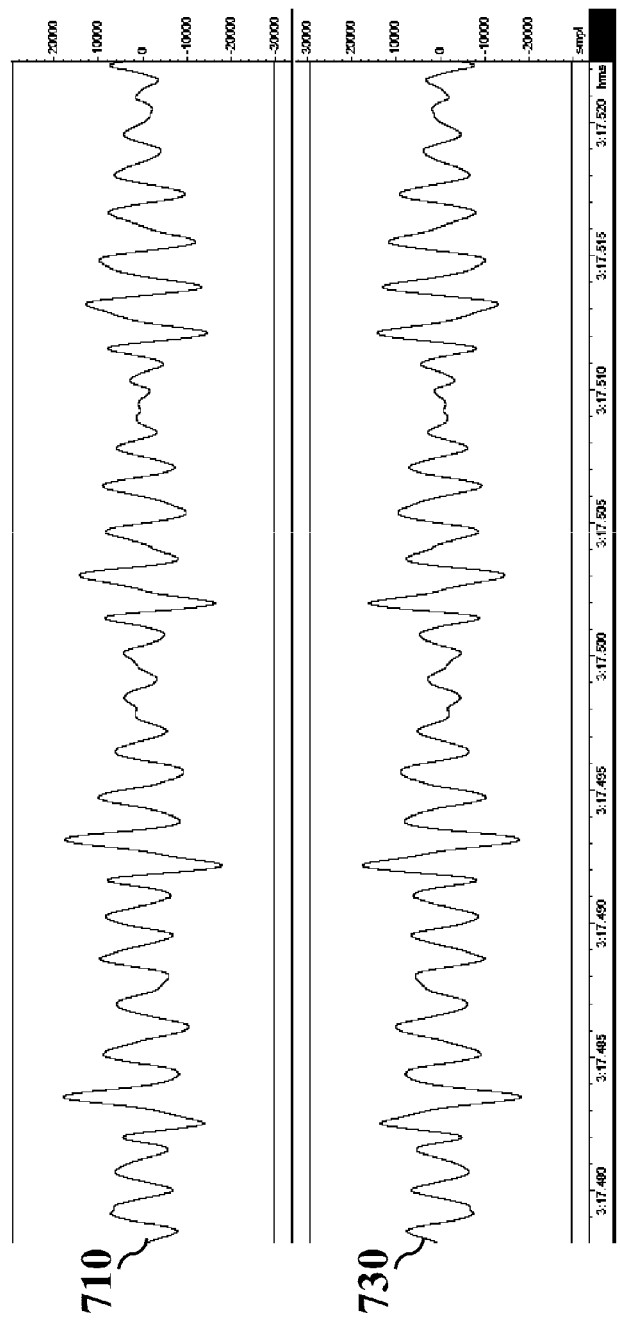
FIG. 12 shows a schematic diagram of the inversion of a speech signal according to an embodiment of the present invention.

For example, referring to FIG. 12, in the embodiment where the inverter is disposed in the left wireless earbud 110 only, the waveform 710 shows an un-inverted analog signal outputted from the amplifier 660 of the right wireless earbud 120, and the waveform 730 shows an inverted analog signal outputted from the amplifier 560 of the left wireless earbud 110. Furthermore, in the embodiment where the inverter is disposed in the right wireless earbud 120 only, the waveform 710 shows an un-inverted analog signal outputted from the amplifier 560 of the left wireless earbud 110, and the waveform 730 shows an inverted analog signal outputted from the amplifier 660 of the right wireless earbud 120.

Figure 13:
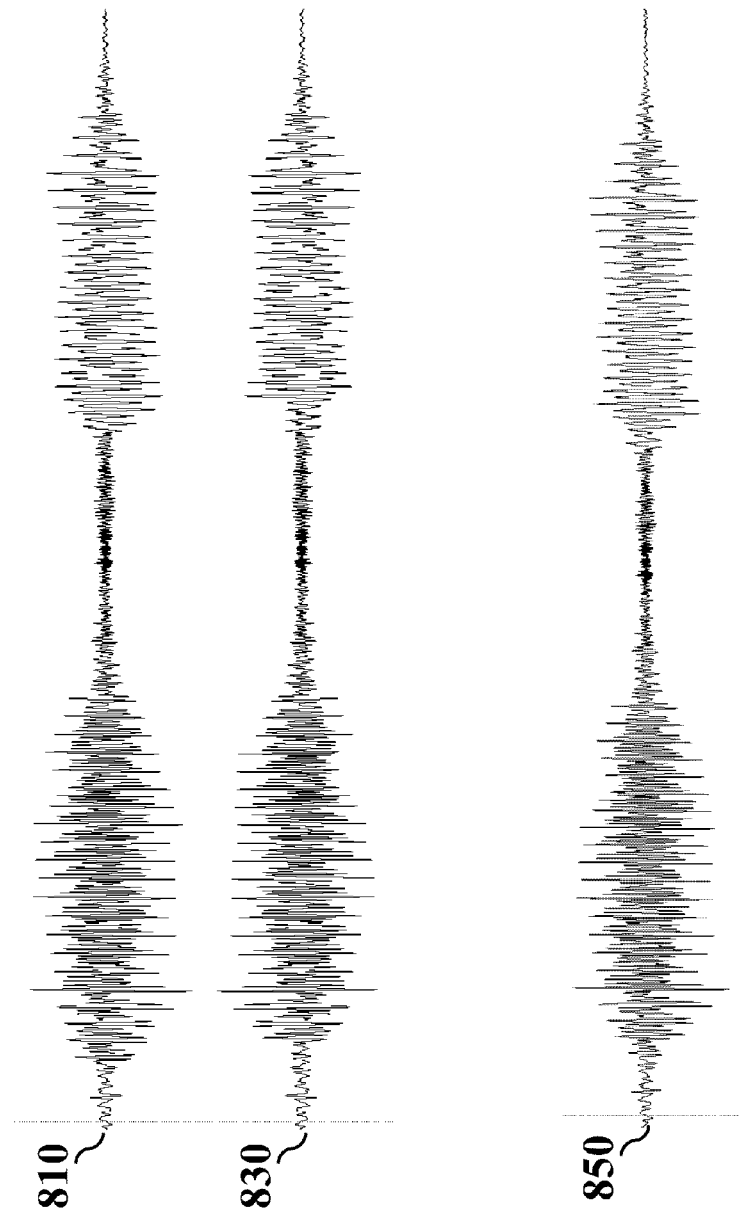
FIG. 13 shows a schematic diagram of the difference between a perfect speech signal and a compensated speech signal according to an embodiment of the present invention.

For example, referring to FIG. 13, assumes that one wireless earbud (for example, the left wireless earbud 110 or the right wireless earbud 120) lost packets, but the other wireless earbud does not. The waveform 810 shows the original output speech signal. The waveform 830 shows the output speech signal, which has been undergone the PLC algorithm. The waveform 850 shows the difference between waveforms 810 and 830. During the time intervals that the amplitudes of both the waveforms 810 and 830 change dramatically, the amplitude of the waveform 850 also changes dramatically, which is different from the waveform 430 of FIG. 4. Referring to FIG. 4, during the time intervals that the amplitudes of both waveforms 410 and 330 change dramatically, the corresponding amplitude of the waveform 430 remains unchanged substantially. However, during the time intervals that the compensated packets are output (for example, the time intervals t30), the amplitude of the waveform 430 has a significant change. Referring back to FIG. 13, comparing to the waveform 430, the signal difference between the waveform 810 and the waveform 830, shown as the waveform 850, always exists. In such situations, the user 10 continuously hears the different speech signals in both ears and would not feel pop sounds accordingly. In addition, regardless of whether the inverter is installed on the downlink speech process path with or without packet loss, the user will not feel the pop sound.

Figure 14:
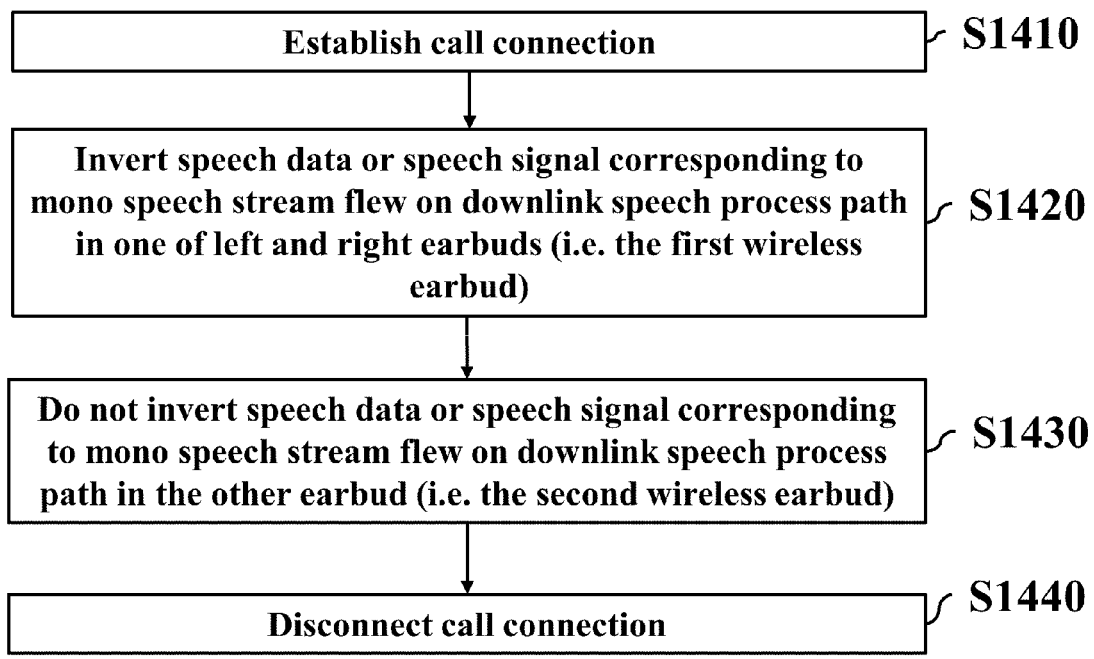
FIG. 14 is a flowchart of a method for enhancing call quality in wireless earbuds according to an embodiment of the present invention.

In order to solve the aforementioned problems, an embodiment of the present invention proposes a method for enhancing call quality, which is applied in wireless earbuds. Referring to FIG. 14, the call quality enhancement method includes steps S1410, S1420, S1430, and S1440, which are individually described in detail as follows:

Step S1410: the mobile phone 130 establishes or builds a call connection with the remote communications device. After successfully establishing a call connection, the mobile phone 130 can send a message to the left wireless earbud 110 and the right wireless earbud 120, so that the left wireless earbud 110 and the right wireless earbud 120 enter a call mode. Once in the call mode, the left wireless earbud 110 and the right wireless earbud 120 may configure components to allow the data of RF signals received from the mobile phone 130 to feed in the downlink speech process path for further processing.

Step S1420: One of the left wireless earbud 110 and the right wireless earbud 120 (also called the first wireless earbud) receives a mono speech stream from the mobile phone 130, and inverts speech data or speech signals corresponding to the mono speech stream (also called the first speech data or signals) flew on the downlink speech process path (also called the first downlink speech process path) in the first wireless earbud. Moreover, please refer to the related content of FIG. 5 to FIG. 11 for the technical details of the inversion, which will not be repeated for brevity.

Step S1430: The other of wireless earbud (also called the second wireless earbud) receives the same mono speech stream from the mobile phone 130 but does not invert the speech data or speech signals corresponding to the mono speech stream (also called the second speech data or signals) flew on the downlink speech process path (also called the second downlink speech process path) in the second wireless earbud. Moreover, please refer to the related content of FIG. 5 to FIG. 11 for the technical details of the inversion, which will not be repeated for brevity.

The mono speech stream as described above is carried in A2DP packets or Bluetooth low energy packets (BLE packets).

Step S1440: the mobile phone 130 disconnects the call connection from the remote communications device. After successfully disconnecting the call connection, the mobile phone 130 sends a message to the left wireless earbud 110 and the right wireless earbud 120 to advise the left wireless earbud 110 and the right wireless earbud 120 to leave the call mode.

Through the steps S1420 and S1430, the speakers 250 and 270 would continuously play different speech signals to prevent the user 10 from feeling uncomfortable pop sounds due to the performance of the PLC algorithm.

Some or all of the aforementioned embodiments of the method of the invention may be implemented in a computer program, such as digital signal processor (DSP) code in a specific programming language, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIGS. 5 to 11, it should be noted that additional elements may be included to achieve better performance without departing from the spirit of the invention. Each element of FIGS. 5 to 11 is composed of various circuits and arranged to operably perform the aforementioned operations. While the process flows described in FIG. 14 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for enhancing speech sound quality, comprising:
 a first wireless earbud, comprising:
  a first speaker; and
  a first downlink speech process path, coupled to the first speaker, comprising a first packet loss concealment (PLC) processor, arranged operably to perform a first algorithm for reducing effects of packet loss for a mono speech data received through a first receiver of the first wireless earbud to generate a first compensated data; an inverter, arranged operably to generate an inverted speech data or an inverted speech signal based on the first compensated data generated by the first PLC processor, whereby enabling the first speaker to play a first analog signal corresponding to the inverted speech data, or the inverted speech signal; and
 a second wireless earbud, comprising:
  a second speaker; and
  a second downlink speech process path, coupled to the second speaker, comprising a second PLC processor, arranged operably to perform the first algorithm for reducing effects of packet loss for the mono speech data received through a second receiver of the second wireless earbud to generate a second compensated data,
 wherein no inverter is disposed on the second downlink speech process path, whereby enabling the second speaker to play a second analog signal corresponding to the second compensated data.

2. The apparatus of claim 1, wherein no physical wire line is connected between the first and the second wireless earbuds.

3. The apparatus of claim 1, wherein the first downlink speech process path further comprises an RX speech data processor and a digital-to-analog converter, wherein the RX speech data processor is arranged operably to perform a second algorithm on the first compensated data for improving call quality to generate a first processed data, the digital-to-analog converter is arranged operably to convert the inverted speech data into the first analog signal, and the inverter is coupled between the RX speech data processor and the digital-to-analog converter, and is arranged operably to receive the first processed data from the RX speech data processor, invert the first processed data to generate the inverted speech data based on the first compensated data generated by the first PLC processor, and output the inverted speech data to the digital-to-analog converter, and wherein the digital-to-analog converter is arranged operably to convert the inverted speech data into the first analog signal to be played by the first speaker.

4. The apparatus of claim 1, wherein the first downlink speech process path further comprises an RX speech data processor, and a digital-to-analog converter, wherein the inverter is coupled between the first PLC processor and the RX speech data processor, and is arranged operably to receive the first compensated data from the first PLC processor, invert the first compensated data to generate the inverted speech data, and output the inverted speech data to the RX speech data processor, wherein the RX speech data processor is arranged operably to perform a second algorithm on the inverted speech data for improving call quality to generate a first processed data, and wherein the digital-to-analog converter is arranged operably to convert the first processed data into the first analog signal to be played by the first speaker.

5. The apparatus of claim 1, wherein the first downlink speech process path further comprises an RX speech data processor, a digital-to-analog converter, and the inverter, wherein the RX speech data processor is arranged operably to perform a second algorithm on the first compensated data for improving call quality to generate a first processed data, wherein the digital-to-analog converter is arranged operably to convert the first processed data into a converted analog signal, and the inverter is coupled between the digital-to-analog converter and an amplifier, and is arranged operably to receive the converted analog signal from the digital-to-analog converter, invert the converted analog signal into the inverted speech signal based on the first compensated data generated by the first PLC processor as the first analog signal, and output the first analog signal to be played by the first speaker.

6. A method for enhancing speech sound quality, applied in a first wireless earbud and a second wireless earbud, wherein the first wireless earbud comprises a first speaker and a first downlink speech process path coupled to the first speaker, the first downlink speech process path comprises a first packet loss concealment (PLC) processor and an inverter, the second wireless earbud comprises a second speaker and a second downlink speech process path coupled to the second speaker, the second downlink speech process path comprises a second PLC processor, the method comprising:
 receiving, by the first PLC processor, a first mono speech stream corresponding to mono speech data transmitted from a mobile phone;
 performing, by the first PLC processor, a first algorithm for reducing effects of packet loss on the first mono speech data to generate a first compensated data;
 generating, by the inverter, an inverted speech data or an inverted speech signal based on the first compensated data generated by the first PLC processor;
 playing, by the first speaker, a first analog signal corresponding to the inverted speech data, or the inverted speech signal;
 receiving, by the second PLC processor, a second mono speech stream corresponding to the mono speech data transmitted from the mobile phone;
 performing, by the second PLC processor, the first algorithm for reducing effects of packet loss on the second mono speech data to generate a second compensated data; and
 playing, by the second speaker, a second analog signal corresponding to the second compensated data.

7. The method of claim 6, wherein the mobile phone establishes a call connection with a remote wireless communications device, and the first and second wireless earbuds enter a call mode.

8. The method of claim 6, wherein the mono speech stream is carried in a BLUETOOTH Advanced Audio Distribution Profile (A2DP) packet or a Bluetooth Low Energy packet.

9. The method of claim 6, wherein no physical wire line is connected between the first and the second wireless earbuds.

10. The method of claim 6, further comprising:
providing an RX speech data processor and a digital-to-analog converter within the first downlink speech process path;
performing, by the RX speech data processor, a second algorithm on the first compensated data for improving call quality to generate a first processed data;
inverting, by the inverter, the first processed data to generate the inverted speech data based on the first compensated data generated by the first PLC processor; and
converting, by the digital-to-analog converter, the inverted speech data into the first analog signal to be played by the first speaker.

11. The method of claim 6, further comprising:
providing an RX speech data processor and a digital-to-analog converter within the first downlink speech process path;
inverting, by the inverter, the first compensated data to generate the inverted speech data;
performing, by the RX speech data processor, a second algorithm on the inverted speech data for improving call quality to generate a first processed data; and
converting, by the digital-to-analog converter, the first processed data into the first analog signal to be played by the first speaker.

12. The method of claim 6, further comprising:
providing an RX speech data processor and a digital-to-analog converter within the first downlink speech process path;
performing, by the RX speech data processor, a second algorithm on the first compensated data for improving call quality to generate a first processed data;
converting, by the digital-to-analog converter, the first processed data into a converted analog signal;
inverting, by the inverter, the converted analog signal into the inverted speech signal based on the first compensated data generated by the first PLC processor as the first analog signal to be played by the first speaker.

* * * * *